United States Patent
Mason et al.

(10) Patent No.: US 8,355,470 B1
(45) Date of Patent: Jan. 15, 2013

(54) DIGITAL POLARIZATION CORRECTION FOR DBS SYSTEMS

(75) Inventors: Shawn M. Mason, Satellite Beach, FL (US); Mark A. Billsberry, Indialantic, FL (US); Ryan C. Groulx, Melbourne, FL (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 791 days.

(21) Appl. No.: 12/387,612

(22) Filed: May 5, 2009

(51) Int. Cl.
*H03D 3/22* (2006.01)
(52) U.S. Cl. ............ 375/332; 375/316; 369/13.31
(58) Field of Classification Search .......... 375/332, 375/316; 369/13.31
See application file for complete search history.

(56) References Cited

U.S. PATENT DOCUMENTS

| | | | | |
|---|---|---|---|---|
| 2001/0024450 A1* | 9/2001 | Takalo et al. | ............. | 370/463 |
| 2003/0162566 A1* | 8/2003 | Shapira et al. | ............. | 455/561 |
| 2004/0259497 A1* | 12/2004 | Dent | ............. | 455/13.3 |
| 2006/0128336 A1* | 6/2006 | Waltman et al. | ............. | 455/273 |
| 2008/0012763 A1* | 1/2008 | Dybdal et al. | ............. | 342/362 |

OTHER PUBLICATIONS

Galuscak, Rastislav, et al., "Circular Polarization and Polarization Loses", 12 pages.

* cited by examiner

*Primary Examiner* — Sam K Ahn
*Assistant Examiner* — Leila Malek
(74) *Attorney, Agent, or Firm* — Donna P. Suchy; Daniel M. Barbieri

(57) ABSTRACT

A first linearly polarized component of a signal is received. A second linearly polarized component of a signal is received, wherein the second linearly polarized signal component of a signal is orthogonal to the first linearly polarized component of a signal. The first linearly polarized component of a signal and the second linearly polarized component of a signal are down-converted to a lower frequency. A polarization correction is performed on the down-converted linearly polarized components.

13 Claims, 3 Drawing Sheets

DIGITAL POLARIZATION CORRECTION FOR DBS SYSTEMS

TECHNICAL FIELD

The present disclosure generally relates to the field of signal processing, and more particularly to a system, method, and product for receiving and processing signals with various polarizations, such as DBS transmissions.

BACKGROUND

Direct Broadcast Satellite (DBS) is a term referring to various worldwide television services broadcast by satellite and intended to be received by the end user. Most DBS providers employ satellites that transmit signals in the Ku frequency band. However, the polarization of these transmitted signals varies from provider to provider. Some providers may transmit a signal using various types of linear polarization. Other providers may transmit a signal using various types of circular polarization.

SUMMARY

A method for receiving signals includes, but is not limited to: receiving a first linearly polarized component of a signal; receiving a second linearly polarized component of a signal, wherein the second linearly polarized signal element of a signal is orthogonal to the first linearly polarized component of a signal; down-converting the first linearly polarized component of a signal and the second linearly polarized component of a signal to a lower frequency; and performing a polarization correction on the down-converted linearly polarized components.

A universal polarization direct broadcast satellite (DBS) receiver system includes, but is not limited to: a first element for receiving a first linearly polarized component of a signal; a second element for receiving a second linearly polarized component of a signal, wherein the second linearly polarized component is orthogonal to the first linearly polarized component; a first frequency down-converter coupled to the first element for receiving the first linearly polarized component of the signal from the first element and down-converting the frequency of the first linearly polarized component of the signal to a lower frequency; a second frequency down-converter coupled to the second element for receiving the second linearly polarized component of the signal from the second element and down-converting the frequency of the second linearly polarized component of the signal to the lower frequency; and a baseband signal processor coupled to the first and the second frequency down-converters for performing polarization correction on the first and the second linearly polarized components of the signal.

A universal polarization DBS receiver includes, but is not limited to: a first element for receiving a first linearly polarized component of a signal; and a second element for receiving a second linearly polarized component of the signal, wherein the second linearly polarized component is orthogonal to the first linearly polarized component.

The universal polarization DBS receiver also includes, but is not limited to: a first antenna signal band-pass filter coupled to the first element for receiving the first linearly polarized component of the signal and filtering out non-DBS frequencies; a second antenna signal band-pass filter coupled to the second element for receiving the second linearly polarized component of the signal and filtering out non-DBS frequencies; a first low-noise amplifier coupled to the first antenna signal band-pass filter for amplifying a DBS frequency signal within the first linearly polarized component of the signal; a second low-noise amplifier coupled to the second antenna signal band-pass filter for amplifying a DBS frequency signal within the second linearly polarized component of the signal; a first low-noise signal band-pass filter coupled to the first low-noise amplifier for receiving an amplified first linearly polarized component of the signal and re-filtering out non-DBS frequencies; and a second low-noise signal band-pass filter coupled to the second low-noise amplifier for receiving the amplified second linearly polarized component of the signal and re-filtering out non-DBS frequencies.

The universal polarization DBS receiver also includes, but is not limited to: a first intermediate mixer coupled to the first low-noise signal band-pass filter and an first local oscillator for receiving the amplified and re-filtered first linearly polarized component of the signal and the first local oscillator signal and mixing the two signals; a second intermediate mixer coupled to the second low-noise signal band-pass filter and the first local oscillator for receiving the amplified and re-filtered second linearly polarized component of the signal and the first local oscillator signal and mixing the two signals; a first intermediate frequency amplifier coupled to the first intermediate mixer for receiving the mixed first linearly polarized component of the signal and generating an amplified intermediate frequency version of the first linearly polarized component of the signal; a second intermediate frequency amplifier coupled to the second intermediate mixer for receiving the mixed second linearly polarized component of the signal and generating an amplified intermediate frequency version of the second linearly polarized component of the signal; a first intermediate frequency band-pass filter coupled to the first intermediate frequency amplifier for receiving the amplified intermediate frequency version of the first linearly polarized component of the signal and filtering out all frequencies except a beat frequency, wherein the beat frequency is the difference between the frequency of the original signal and the frequency of the first local oscillator signal; and a second intermediate frequency band-pass filter coupled to the second intermediate frequency amplifier for receiving the amplified intermediate frequency version of the second linearly polarized component of the signal and filtering out all frequencies except the beat frequency.

The universal polarization DBS receiver also includes, but is not limited to: a first second-stage mixer coupled to the first intermediate frequency band-pass filter and a second local oscillator for receiving a beat frequency filtered version of the first linearly polarized component of the signal and a second local oscillator signal and mixing the two signals; a second second-stage mixer coupled to the second intermediate frequency band-pass filter and the second local oscillator for receiving a beat frequency filtered version of the second linearly polarized component of the signal and the second local oscillator signal and mixing the two signals; a second-stage band-pass filter coupled to the first second-stage mixer for receiving a re-mixed first linearly polarized component of the signal and generating a sampleable first linearly polarized component of the signal; and a second second-stage band-pass filter coupled to the second second-stage mixer for receiving a re-mixed second linearly polarized component of the signal and generating a sampleable second linearly polarized component of the signal.

The universal polarization DBS receiver also includes, but is not limited to: an analog-to-digital converter coupled to the first second-stage band-pass filter for receiving the sampleable first linearly polarized component of the signal and generating digital baseband data for the first linearly polarized component of the signal; a second analog-to-digital converter coupled to the second second-stage band-pass filter for receiving the sampleable second linearly polarized component of the signal and generating digital baseband data for the second linearly polarized component of the signal; a field-programmable gate array (FPGA) or a digital signal processor (DSP) coupled to the first and the second analog-to-digital converters for receiving the digital baseband data for the first and the second linearly polarized components of the signal and performing polarization correction on the first and the second linearly polarized components of the signal, wherein the performing polarization correction on the digital baseband data for the first and the second linearly polarized components of the signal further includes at least one of: adjusting the phase difference between the digital baseband data for the first and the second linearly polarized elements of the signal to account for the difference in electrical length of the paths of the first and the second linearly polarized components of the signal, adjusting the gain of the digital baseband data for the first and the second linearly polarized elements of the signal to account for the difference in electrical length of the paths of the first and the second linearly polarized components of the signal, adjusting the phase difference between the digital baseband data for the first and the second linearly polarized components of the signal±90 degrees with respect to each other, combining the adjusted digital baseband data for the first and the second linearly polarized components of the signal in order to recreate a signal, and performing a polarization loss factor correction on the digital baseband data for the first and the second linearly polarized components in order to recreate a linearly polarized signal.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Figure 1:
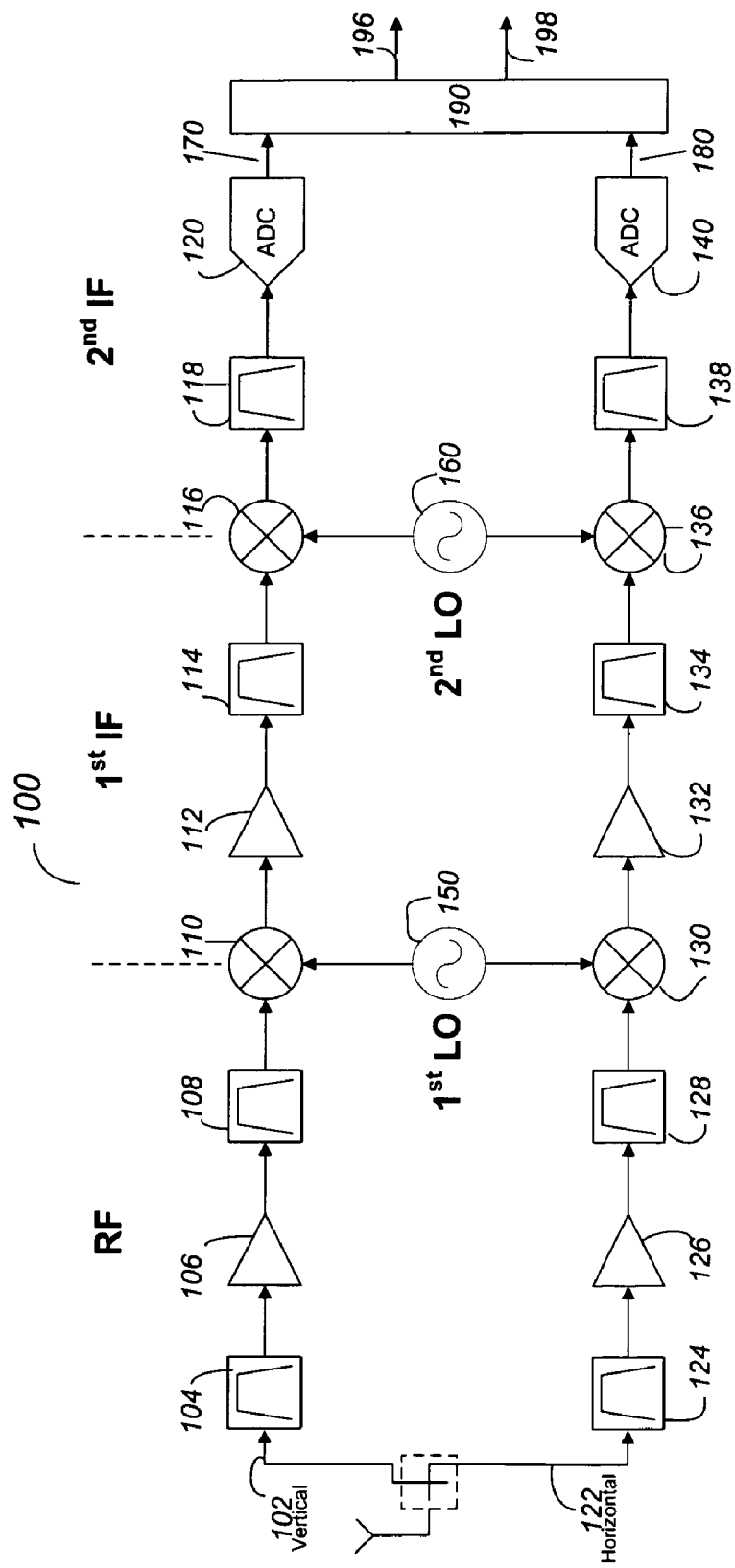
FIG. 1 is a block diagram illustrating a universal polarization DBS receiver system.
Figure 2:
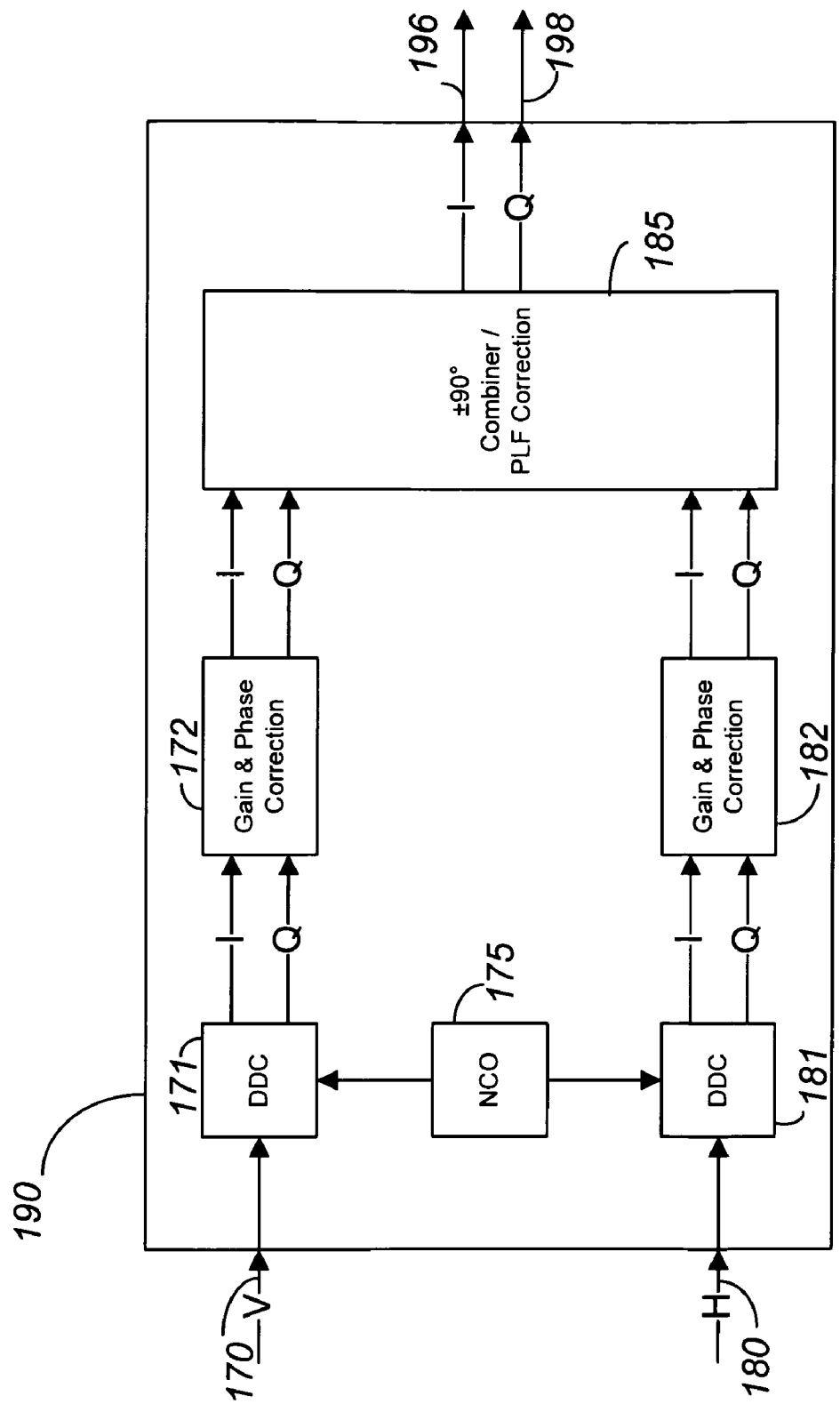
FIG. 2 is a block diagram illustrating in greater detail a baseband signal processor of FIG. 1.
Figure 3:
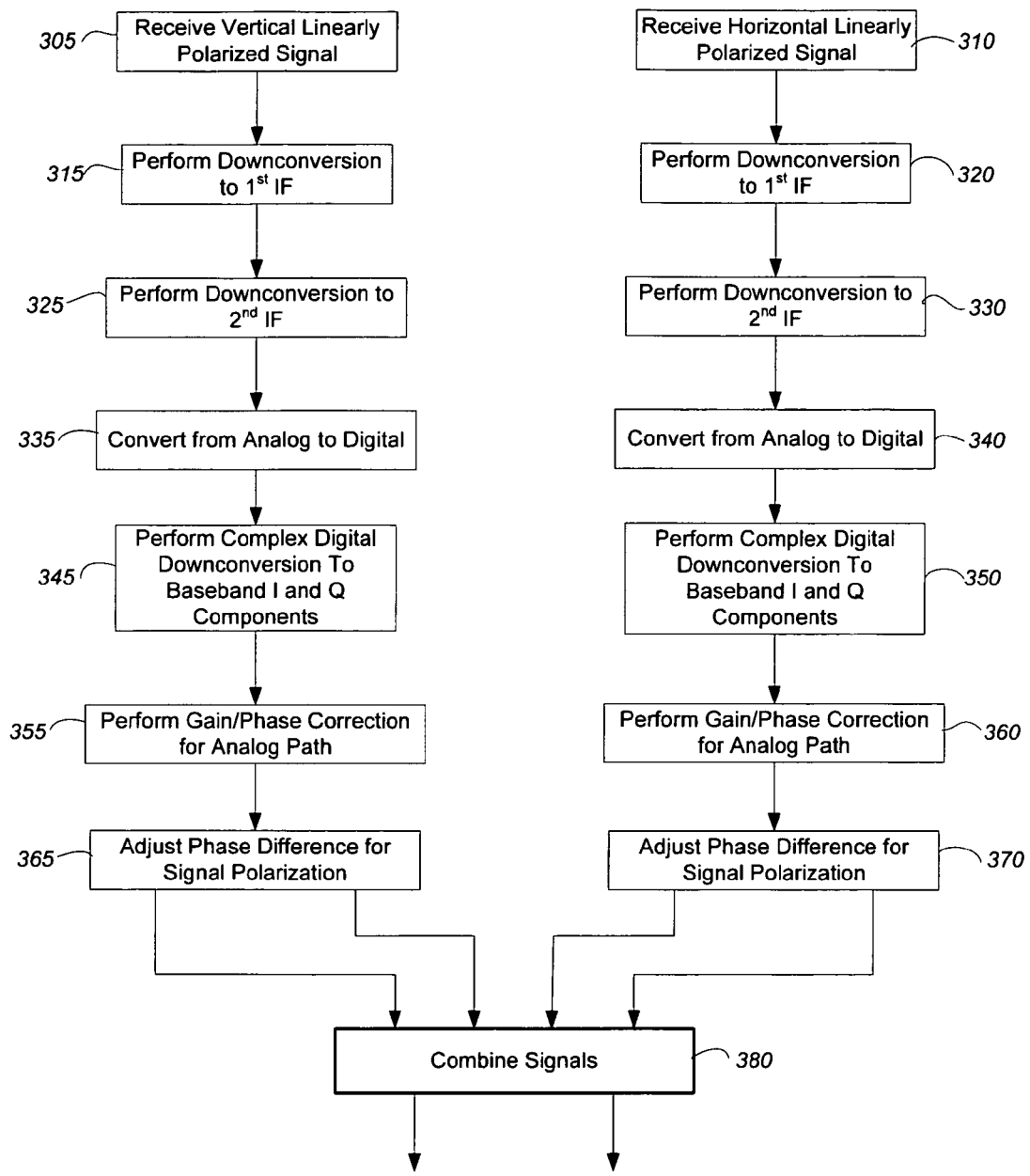
FIG. 3 is a flow diagram illustrating a method for receiving DBS transmissions having various signal polarizations.

Reference will now be made in detail to the subject matter disclosed, which is illustrated in the accompanying drawings.

A universal polarization DBS receiver system in accordance with an exemplary embodiment of the present disclosure is shown. The system 100 may include at least two elements 102, 122, configured to receive a linearly polarized aspect of a transmitted signal. Element 102 may be configured to receive a linearly polarized signal that is orthogonal to the linearly polarized signal element 122 is configured to receive. For example, elements 102, 122 may be co-located orthogonal elements of a single collector. At least two band-pass filters 104, 124 may be configured to receive signals from elements 102, 122. Band-pass filters 104, 124 may be configured to filter out non-DBS frequencies.

The filtered signal from band-pass filters 104, 124 may be provided to at least two low-noise amplifiers 106, 126 for amplification. The signal provided to low-noise amplifiers 106, 126 may be limited to a specific set of frequencies by band-pass filters 104, 124. The amplified signal from low-noise amplifiers 106, 126 may be provided to at least two band-pass filters 108, 128 to perform a second filtering out of the non-DBS frequencies on the signal. The filtered signals from band-pass filters 108, 128 may be provided to at least two mixers 110, 130 along with a sinusoidal signal from first local oscillator 150 in order to down-convert the frequencies of the filtered signals from band-pass filters 108, 128 to a lower intermediate frequency. Further, first local oscillator 150 may be configured to use a phase-lock loop in order to provide a stable sinusoidal signal to mixers 110, 130.

The first intermediate frequency signals from mixers 110, 130 may be provided to at least two amplifiers 112, 132 for amplification before being provided to at least two band-pass filters 114, 134. Band-pass filters 114, 134 may be configured to filter out the non-first intermediate frequencies from the down-converted signals. The first intermediate frequencies may be the set of frequencies that constitute the difference between the original DBS signal and first local oscillator 150.

The filtered first intermediate frequency signal from band-pass filters 114, 134 may be provided to at least two mixers 116, 136 along with a sinusoidal signal from second local oscillator 160 in order to perform a further down-conversion of the frequencies of the filtered signals to a lower frequency. Second local oscillator 160 may be configured to use a phase-lock loop in order to provide a stable sinusoidal signal to mixers 116, 136. Mixers 116, 136 may be replaced with quadrature demodulators (not shown). The frequency of the sinusoidal signal from oscillator 160 may be selected so the lower frequency is the frequency for audio and video processing.

The second intermediate frequency signals from mixers 116, 136 may be provided to at least two filters 118, 138. Filters 118, 138 may be configured to filter out the second intermediate frequencies from the further down-converted signals. The second intermediate frequencies may be the set of frequencies that constitute the difference between the first intermediate frequency signals and oscillator 160. Filters 118, 138 may be either band-pass filters or low-pass filters. In an embodiment of the disclosure, various aspects of at least one of the above filters, amplifiers, mixers, and oscillators may be implemented in a low-noise block down-converter (LNB).

The filtered second intermediate frequency signals from 118, 138 may be provided to at least two analog-to-digital converters 120, 140 for conversion from analog to digital. The converted second intermediate frequency signals may be the digital data for the DBS receiver system.

The digital data for at least one of the signals received by elements 102, 122 may be provided to baseband signal processor 190 for processing digital data 170, 180 in order to produce a final in-phase signal component 196 and final quadrature signal component 198. Baseband signal processor 190 may be any suitable signal processing component including, but not limited to a field-programmable gate array (FPGA) or a digital signal processor (DSP). Digital data 170, 180 may possess a single component or may possess both an in-phase component and a quadrature component depending on the configuration of system 100. Digital data 170, 180 may be provided to digital down converters (DDC) 171, 181 along with a signal from numerically controlled oscillator (NCO)

175 in order to perform a final frequency down-conversion. DDC 171, 181 may provide in-phase and quadrature components of the down-converted digital data 170, 180 for polarization correction. The polarization correction may include adjusting the gain and phase difference 172, 182 between the two sets of in-phase and quadrature components of the down-converted digital data 170, 180 to account for the difference in electrical length between the two paths from elements 102, 122 to baseband signal processor 190. The polarization correction may include adjusting the phase difference 185 between the two sets of in-phase and quadrature components of the down-converted digital data 170, 180 plus/minus 90 degrees with respect to each other in order to create a circularly polarized signal. Adjusting the phase difference 185 between the two sets of in-phase and quadrature components of the down-converted digital data 170, 180 plus 90 degrees with respect to each other or minus 90 degrees with respect to each other may depend on what direction the created circularly polarized signal is to be polarized. The polarization correction may include combining 185 the two sets of in-phase and quadrature components of the down-converted digital data 170, 180 to create a frequency down-shifted digital version of the original transmitted signal. The polarization correction may also include polarization loss factor correction 185 on the two sets of in-phase and quadrature components of the down-converted digital data 170, 180 in the case of linearly polarized signal recreation. Adjusting the gain and phase difference 172, 182 between the two sets of in-phase and quadrature components of the down-converted digital data 170, 180, adjusting the phase difference 185 between the two sets of in-phase and quadrature components of the down-converted digital data 170, 180 plus/minus 90 degrees with respect to each other in order to create a circularly polarized signal, combining 185 the two sets of in-phase and quadrature components of the down-converted digital data 170, 180, and performing polarization loss factor correction 185 on the two sets of in-phase and quadrature components of the down-converted digital data 170, 180, may occur in various orders or may occur simultaneously.

In a further embodiment of the present disclosure, a diagram illustrating a method 300 for receiving broadcast signals with various polarizations is provided. Step 205 depicts receiving a linearly polarized aspect of a signal. Step 310 depicts receiving a second linearly polarized aspect of a signal. Step 305 and step 310 may be performed concurrently. Step 315 depicts performing a frequency down-conversion on the linearly polarized aspect of the signal from step 305 to an intermediate frequency. Step 320 depicts performing a frequency down-conversion on the linearly polarized aspect of the signal from step 310 to an intermediate frequency. Step 215 and step 320 may be performed concurrently. Step 325 depicts performing a further down-conversion on the linearly polarized aspect of the signal from step 315 to a frequency that can be received and processed for audio and video information. Step 330 depicts performing a further down-conversion on the linearly polarized aspect of the signal from step 320 to a frequency that can be received and processed for audio and video information. Step 325 and step 330 may be performed concurrently. In an embodiment of the present disclosure, at least one or more of Steps 310 through 330 may be performed by a LNB.

Step 335 depicts converting the linear aspect of the signal from step 325 from an analog signal to a digital signal. Step 340 depicts converting the linear aspect of the signal from step 330 from an analog signal to a digital signal. Step 335 and step 340 may be performed concurrently. Step 345 depicts adjusting the phase difference between the two digital signals from step 335 and step 340 to account for the difference in electrical paths between the two digital signals. Step 350 depicts adjusting the phase difference between the two digital signals to account for the polarization of the original signal. Step 355 depicts combining the two digital signals to create a frequency down-shifted digital version of the original broadcast signal. In an embodiment of the present disclosure, at least one of steps 335 through 355 may be performed by a baseband signal processor.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is mere explanatory, and it is the intention of the following claims to encompass and include such changes.

What is claimed is:
1. A method for receiving signals, comprising:
receiving a first linearly polarized component of a signal;
down-converting the first linearly polarized component to a lower intermediate frequency, prior to the step of down-converting the first linearly polarized component to the lower intermediate frequency, amplifying and band pass filtering the first linearly polarized component;
further down-converting the first linearly polarized component from the lower intermediate frequency to a beat frequency suitable for audio/video processing, prior to the step of down-converting the first linearly polarized component from the intermediate frequency to the beat frequency, amplifying and band pass filtering the first linear component at the lower intermediate frequency;
analog-to-digital converting the first linearly polarized component to produce a digital representation of the first linearly polarized component at the beat frequency;
receiving a second linearly polarized component of the signal, wherein the second linearly polarized signal element is orthogonal to the first linearly polarized component;
down-converting the second linearly polarized component to the lower intermediate frequency, prior to the step of down-converting the second linearly polarized component to the lower intermediate frequency, amplifying and band pass filtering the second linearly polarized component;
further down-converting the second linearly polarized component from the lower intermediate frequency to the beat frequency, prior to the step of down-converting the second linearly polarized component from the lower intermediate frequency to the beat frequency, amplifying and band pass filtering the second linear component at the intermediate frequency;

analog-to-digital converting the second linearly polarized component to produce a digital representation of the second linearly polarized component at the beat frequency; and performing polarization correction on the first and second digital representations of the linearly polarized components, wherein the step of performing polarization correction on the down-converted linearly polarized components further includes adjusting gain and phase difference between the digital representations of the first and second components to account for a difference in electrical length between two down-conversion paths and performing polarization loss factor correction on the down-converted linearly polarized components in order to recreate a linearly polarized signal.

2. The method of claim 1, further comprising the steps of:

prior to the step of analog-to-digital converting the first linearly polarized component, band pass filtering the first linearly polarized component at the beat frequency; and prior to the step of analog-to-digital converting the second linearly polarized component, band pass filtering the second linear component at the beat frequency.

3. The method of claim 2, further comprising the steps of, prior to the step of performing polarization correction on the first and second digital representations of the linearly polarized components:

digitally down-converting the first linearly polarized component from the beat frequency to a final digital processing frequency; and digitally down-converting the second linearly polarized component from the beat frequency to a final digital processing frequency.

4. The method of claim 1, wherein the step of performing polarization correction on the down-converted linearly polarized components further includes:

adjusting the phase difference between the digital representations of the first and second components±90 degrees with respect to each other and combining the adjusted components in order to recreate a circularly polarized signal.

5. A universal polarization direct broadcast satellite (DBS) receiver system comprising:

a first element for receiving a first linearly polarized component of a signal;

a second element for receiving a second linearly polarized component of the signal, wherein the second linearly polarized component is orthogonal to the first linearly polarized component;

a first frequency down-converter coupled to the first element for receiving the first linearly polarized component from the first element and down-converting first linearly polarized component to a lower intermediate frequency;

a second frequency down-converter coupled to the first element for receiving the first linearly polarized component at the lower intermediate frequency and further down-converting the first linearly polarized component to a beat frequency suitable for audio/video processing;

a third frequency down-converter coupled to the second element for receiving the second linearly polarized component from the second element and down-converting the frequency of the second linearly polarized component to the lower intermediate frequency;

a fourth frequency down-converter coupled to the second element for receiving the second linearly polarized component at the intermediate frequency and further down-converting the frequency of the second linearly polarized component of the signal to the beat frequency;

a first analog-to-digital converter coupled to the second frequency down-converter for producing a digital representation of the first linearly polarized component;

a second analog-to-digital converter coupled to the fourth frequency down-converter for producing a digital representation of the second linearly polarized component;

a baseband signal processor coupled to the first and the second analog-to-digital converters for performing polarization correction on the digital representations of the first and the second linearly polarized components of the signal; and a first digital down-converter for converting the digital representation of the first component from the beat frequency to a final digital processing frequency; and a second digital down-converter for converting the digital representation of the second component from the beat frequency to the final digital processing frequency, wherein the digital representation of each component further includes an in-phase component and a quadrature component, the baseband signal processor is further configured to perform polarization loss factor correction on the first and the second linearly polarized components in order to recreate a linearly polarized signal.

6. The system of claim 5, further comprising:

a first band pass filter and a first amplifier located between the first element and the first frequency down-converter; and a second band pass filter and a second amplifier located between the first frequency down-converter and the second frequency down-converter.

7. The system of claim 5, wherein the baseband signal processor coupled to the first frequency down-converter and the second frequency down-converter for performing polarization correction on the first and the second linearly polarized components of the signal comprises a field-programmable gate array (FPGA) or a digital signal processor (DSP); and wherein the baseband signal processor is further configured to perform a polarization correction on the first and the second linearly polarized components of the signal at the final digital processing frequency.

8. The system of claim 5, wherein the baseband signal processor is further configured to perform polarization correction on the first and the second linearly polarized components of the signal by adjusting the gain and phase difference between the digital representations of the linear components to account for a difference in electrical length between two down-conversion paths.

9. The system of claim 5, wherein the baseband signal processor is further configured to perform polarization correction on the first and the second linearly polarized components of the signal by adjusting the phase difference between the digital representations of the linear components±90 degrees with respect to each other and combine the adjusted components to recreate a circularly polarized signal.

10. The system of claim 6, wherein at least one of the first frequency down-converter and the second frequency down-converter is a Low Noise Block down-converter.

11. A universal polarization direct broadcast satellite (DBS) receiver comprising:

a first element for receiving a first linearly polarized component of a signal;

a second element for receiving a second linearly polarized component of the signal, wherein the second linearly polarized component is orthogonal to the first linearly polarized component;

a first antenna signal band-pass filter coupled to the first element for receiving the first linearly polarized component of the signal and filtering out non-DBS frequencies;

a second antenna signal band-pass filter coupled to the second element for receiving the second linearly polarized component of the signal and filtering out non-DBS frequencies;

a first low-noise amplifier coupled to the first antenna signal band-pass filter for amplifying a DBS frequency signal within the first linearly polarized component of the signal;

a second low-noise amplifier coupled to the second antenna signal band-pass filter for amplifying a DBS frequency signal within the second linearly polarized component of the signal;

a first low-noise signal band-pass filter coupled to the first low-noise amplifier for receiving an amplified first linearly polarized component of the signal and re-filtering out non-DBS frequencies;

a second low-noise signal band-pass filter coupled to the second low-noise amplifier for receiving the amplified second linearly polarized component of the signal and re-filtering out non-DBS frequencies;

a first intermediate frequency mixer coupled to the first low-noise signal band-pass filter and first local oscillator for receiving the amplified and re-filtered first linearly polarized component of the signal and the first local oscillator signal and mixing the two signals;

a second intermediate frequency mixer coupled to the second low-noise signal band-pass filter and the first local oscillator for receiving the amplified and re-filtered second linearly polarized component of the signal and the first local oscillator signal and mixing the two signals;

a first component second stage mixer coupled to the first intermediate frequency mixer and a second local oscillator for receiving the first linear component at the intermediate frequency and further down-converting the first linear component to a beat frequency suitable for audio/video processing;

a second component second stage mixer coupled to the second intermediate frequency mixer and the second local oscillator for receiving the second linear component at the intermediate frequency and further down-converting the second linear component to the beat frequency;

a first analog-to-digital converter coupled to the first component second stage mixer for producing a digital representation of the first linear component;

a second analog-to-digital converter coupled to the second component second stage mixer for producing a digital representation of the second linear component; and a baseband signal processor coupled to the first and the second analog-to-digital converters for performing polarization correction on the digital representations of the first and the second linearly polarized components of the signal.

12. The universal polarization direct broadcast satellite (DBS) receiver of claim 11, further including:

a first intermediate frequency amplifier coupled to the first intermediate mixer for receiving the mixed first linearly polarized component of the signal and generating an amplified intermediate frequency version of the first linearly polarized component of the signal;

a second intermediate frequency amplifier coupled to the second intermediate mixer for receiving the mixed second linearly polarized component of the signal and generating an amplified intermediate frequency version of the second linearly polarized component of the signal;

a first intermediate frequency band-pass filter coupled to the first intermediate frequency amplifier for receiving the amplified intermediate frequency version of the first linearly polarized component of the signal and filtering out all frequencies except a beat frequency, wherein the beat frequency is the difference between the frequency of the original signal and the frequency of the first local oscillator signal; and a second intermediate frequency band-pass filter coupled to the second intermediate frequency amplifier for receiving the amplified intermediate frequency version of the second linearly polarized component of the signal and filtering out all frequencies except the beat frequency.

13. The universal polarization direct broadcast satellite (DBS) receiver of claim 12, further including:

a second-stage band-pass filter coupled to the first second-stage mixer for receiving a re-mixed first linearly polarized component of the signal and generating a sampleable first linearly polarized component of the signal;

a second second-stage band-pass filter coupled to the second second-stage mixer for receiving a re-mixed second linearly polarized component of the signal and generating a sampleable second linearly polarized component of the signal; and a field-programmable gate array (FPGA) or a digital signal processor (DSP) coupled to the first and the second analog-to-digital converters for receiving the digital representations of the first and the second linearly polarized components of the signal and performing polarization correction on the first and the second linearly polarized components of the signal, wherein the polarization correction includes at least one of: adjusting the phase difference between the digital representations of the first and the second linearly polarized elements of the signal to account for the difference in electrical length of the paths of the first and the second linearly polarized components of the signal, adjusting the gain of the digital representations of the first and the second linearly polarized elements of the signal to account for the difference in electrical length of paths of the first and the second linearly polarized components of the signal, adjusting the phase difference between the digital representations of the first and the second linearly polarized components of the signal±90 degrees with respect to each other to create a circularly polarized signal, combining the adjusted digital representations of the first and the second linearly polarized components of the signal in order to recreate a signal, and performing a polarization loss factor correction on the digital baseband data for the first and the second linearly polarized components in order to recreate a linearly polarized signal.

* * * * *